(12) United States Patent
Hara et al.

(10) Patent No.: US 7,692,261 B2
(45) Date of Patent: Apr. 6, 2010

(54) OPTICAL SENSOR ELEMENT AND METHOD FOR DRIVING THE SAME

(75) Inventors: Yujiro Hara, Yokohama (JP); Akira Kinno, Yokohama (JP); Tsuyoshi Hioki, Yokohama (JP); Isao Amemiya, Machida (JP); Shuichi Uchikoga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 11/850,307

(22) Filed: Sep. 5, 2007

(65) Prior Publication Data

US 2008/0217623 A1   Sep. 11, 2008

(30) Foreign Application Priority Data

Mar. 8, 2007   (JP) ............................. 2007-058798

(51) Int. Cl.
*H01L 31/075* (2006.01)
(52) U.S. Cl. ................................ 257/458; 257/E31.061
(58) Field of Classification Search ................ 257/458, 257/E31.061
See application file for complete search history.

(56) References Cited

U.S. PATENT DOCUMENTS

2008/0217623 A1*   9/2008   Hara et al. ................. 257/66

FOREIGN PATENT DOCUMENTS

JP            2005-79438        3/2005

* cited by examiner

*Primary Examiner*—Mark Prenty
(74) *Attorney, Agent, or Firm*—Oblon, Spivak, McClelland, Maier & Neustadt, L.L.P.

(57) ABSTRACT

An optical sensor element includes: an n-type semiconductor region formed on a substrate; an i-type semiconductor region which is formed on the substrate between the p-type semiconductor region and the n-type semiconductor region and which is lower in impurity concentration than the p-type semiconductor region and the n-type semiconductor region; an anode electrode formed on the insulation film and connected to the p-type semiconductor region; and a cathode electrode formed on the insulation film and connected to the n-type semiconductor region. A reverse bias voltage $V_b$ is applied when detecting the photocurrent, the reverse bias voltage $V_b$ satisfying a following relation.

$$V_1 < V_b < V_{sat}$$

10 Claims, 7 Drawing Sheets

PRIOR ART

OPTICAL SENSOR ELEMENT AND METHOD FOR DRIVING THE SAME

CROSS-REFERENCE TO RELATED APPLICATION

This application is based upon and claims the benefit of priority from prior Japanese Patent Application No. 2007-58798 filed on Mar. 8, 2007 in Japan, the entire contents of which are incorporated herein by reference.

BACKGROUND OF THE INVENTION

1. Field of the Invention

The present invention relates to an optical sensor element of lateral pin structure diode type, and its drive method.

2. Related Art

In recent years, photodetection elements (such as photodiodes) using polycrystalline silicon or amorphous silicon formed as a film on a substrate by using the CVD method have been developed vigorously. A planar type illuminance detector is implemented by arranging photodiodes on a substrate. These photodiodes can be formed on a glass substrate or the like by diverting the technique of the thin film transistor (TFT) array used in, for example, liquid crystal displays.

In the typical conventional photodiodes, a reverse bias is applied in a vertical pin structure in which the pin structure is disposed perpendicular to the substrate or a lateral pin structure in which the pin structure is disposed in parallel to the substrate, and illuminance of light is detected by measuring a photocurrent that flows when the light is applied (see, for example, JP-A 2005-79438 (KOKAI)).

However, the vertical pin structure has a problem that the number of processes increases because it cannot be formed by using the same process as that of the TFTs for driving the photodiodes.

On the other hand, the lateral pin structure has a problem that the magnitude of the photocurrent becomes small although the structure can be formed in the same process as that of TFTs for driving the photodiodes. Furthermore, if the length of an i-region serving as a light receiving part of a photodiode in a direction sandwiched between a p-region and an n-region is lengthened, the value of the photocurrent varies among photodiodes having the same structure, resulting in another problem.

SUMMARY OF THE INVENTION

The present invention has been made in view of these circumstances, and an object thereof is to provide an optical sensor element that can be made large in photocurrent output and made small in output variation and a method for driving the optical sensor element.

An optical sensor element according to a first aspect of the present invention includes: a substrate; a p-type semiconductor region formed on the substrate; an n-type semiconductor region formed on the substrate; an i-type semiconductor region which is formed on the substrate between the p-type semiconductor region and the n-type semiconductor region and which is lower in impurity concentration than the p-type semiconductor region and the n-type semiconductor region; an insulation film formed so as to cover the p-type semiconductor region, the n-type semiconductor region and the i-type semiconductor region; an anode electrode formed on the insulation film and connected to the p-type semiconductor region; and a cathode electrode formed on the insulation film and connected to the n-type semiconductor region, wherein $V_d$ denotes a reverse bias voltage between the anode electrode and the cathode electrode, $I_p$ denotes a photocurrent flowing between the anode electrode and the cathode electrode when the i-type semiconductor region is irradiated with light, $V_{sat}$ denotes a saturation voltage in $I_p$-$V_d$ characteristics, and $V_1$ denotes a reverse bias voltage $V_d$ at a crosspoint of a tangential line at $V_d=0$ for the $I_p$-$V_d$ characteristics in a first region in which the reverse bias voltage $V_d$ is lower than the saturation voltage $V_{sat}$ and a straight line of the $I_p$-$V_d$ characteristics in a second region in which the reverse bias voltage $V_d$ is the saturation voltage $V_{sat}$ or more, and the reverse bias voltage $V_b$ is applied when detecting the photocurrent, the reverse bias voltage $V_b$ satisfying a following relation.

$$V_1 < V_b < V_{sat}$$

An optical sensor element according to a second aspect of the present invention includes: a substrate; a p-type semiconductor region formed on the substrate; an n-type semiconductor region formed on the substrate; an i-type semiconductor region which is formed on the substrate between the p-type semiconductor region and the n-type semiconductor region and which is lower in impurity concentration than the p-type semiconductor region and the n-type semiconductor region; an insulation film formed so as to cover the p-type semiconductor region, the n-type semiconductor region and the i-type semiconductor region; an anode electrode formed on the insulation film and connected to the p-type semiconductor region; and a cathode electrode formed on the insulation film and connected to the n-type semiconductor region, wherein $V_d$ denotes a reverse bias voltage between the anode electrode and the cathode electrode, $I_p$ denotes a photocurrent flowing between the anode electrode and the cathode electrode when the i-type semiconductor region is irradiated with light, and $V_{sat}$ denotes a saturation voltage in $I_p$-$V_d$ characteristics, and the reverse bias voltage $V_b$ is applied when detecting the photocurrent, the reverse bias voltage $V_b$ satisfying a following relation.

$$V_{sat} < V_b < 1.2 \times V_{sat}$$

According to a third aspect of the present inventions, there is a method for driving an optical sensor element having a lateral pin structure and including a p-type semiconductor region, an n-type semiconductor region, an i-type semiconductor region which is formed between the p-type semiconductor region and the n-type semiconductor region and which is lower in impurity concentration than the p-type semiconductor region and the n-type semiconductor region, an anode electrode connected to the p-type semiconductor region, and a cathode electrode connected to the n-type semiconductor region, the method comprising:

applying a reverse bias voltage $V_b$ when detecting the photocurrent, the reverse bias voltage $V_b$ satisfying a following relation, $$V_1 < V_b < V_{sat}$$

where $V_d$ denotes a reverse bias voltage between the anode electrode and the cathode electrode, $I_p$ denotes a photocurrent flowing between the anode electrode and the cathode electrode when the i-type semiconductor region is irradiated with light, $V_{sat}$ denotes a saturation voltage in $I_p$-$V_d$ characteristics, and $V_1$ denotes a reverse bias voltage $V_d$ at a crosspoint of a tangential line at $V_d=0$ for the $I_p$-$V_d$ characteristics in a first region in which the reverse bias voltage $V_d$ is lower than the saturation voltage $V_{sat}$ and a straight line of the $I_p$-$V_d$ characteristics in a second region in which the reverse bias voltage $V_d$ is the saturation voltage $V_{sat}$ or more.

According to a fourth aspect of the present inventions, there is a method for driving an optical sensor element having a lateral pin structure and including a p-type semiconductor region, an n-type semiconductor region, an i-type semiconductor region which is formed between the p-type semiconductor region and the n-type semiconductor region and which is lower in impurity concentration than the p-type semiconductor region and the n-type semiconductor region, an anode electrode connected to the p-type semiconductor region, and a cathode electrode connected to the n-type semiconductor region, the method comprising:

applying a reverse bias voltage $V_b$ when detecting the photocurrent, the reverse bias voltage $V_b$ satisfying a following relation, $$V_{sat} < V_b < 1.2 \times V_{sat}$$

where $V_d$ denotes a reverse bias voltage between the anode electrode and the cathode electrode, $V_{sat}$ denotes a photocurrent flowing between the anode electrode and the cathode electrode when the i-type semiconductor region is irradiated with light by $I_p$, and a saturation voltage in $I_p$-$V_d$ characteristics.

DETAILED DESCRIPTION OF THE INVENTION

First, before describing the embodiment of the present invention, the course of events for achieving the present invention will be described below.

The present inventors examined in detail about the fact that the value of the photocurrent varies among photodiodes having the same lateral pin structure. As a result, facts described hereafter have been found. The facts will now be described with reference to drawings.

Figure 8:
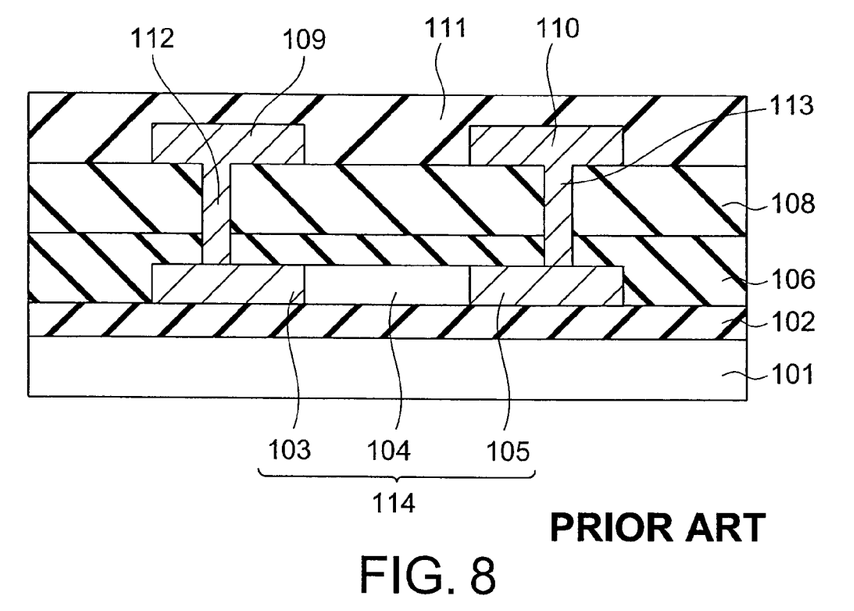
FIG. 8 is a sectional view of a typical optical sensor element.

A section of a representative configuration of a photodiode having a lateral pin structure is shown in FIG. 8. An undercoat layer 102 formed of an insulation film is provided on a substrate 101. A p-type semiconductor region formed of polycrystalline silicon with p-type impurities implanted at a high concentration (hereafter referred to as $p^+$-region) 103, an i-type semiconductor region (hereafter referred to as i-region) 104 having a low impurity concentration, and an n-type semiconductor region with n-type impurities implanted at a high concentration (hereafter referred to as $n^+$-region) 105 are formed on the undercoat layer 102. The i-region may be a p-type semiconductor with p-type impurities implanted at a low concentration (hereafter referred to as $p^-$) or an n-type semiconductor with n-type impurities implanted at a low concentration (hereafter referred to as $n^-$). The $p^+$-region and the $n^+$-region should have a carrier concentration of $1 \times 10^{18}$ cm$^{-3}$ or more, and the i-region should have a carrier concentration of $1 \times 10^{17}$ cm$^{-3}$ or less.

A silicon oxide film 106 is formed so as to cover the $p^+$-region 103, the i-region 104, and the $n^+$-region 105. A silicon oxide film 108 is formed on the silicon oxide film 106. An anode electrode 109 and a cathode electrode 110 each formed of metal or the like are formed on the silicon oxide film 108. The anode electrode 109 is connected to the $p^+$-region 103 via a contact 112 provided through the silicon oxide film 108 and the silicon oxide film 106. The cathode electrode 110 is connected to the $n^+$-region 105 via a contact 113 provided through the silicon oxide film 108 and the silicon oxide film 106. A silicon nitride film 111 is formed on the silicon oxide film 108, the anode electrode 109 and the cathode electrode 110. A pin-type diode 114 including the polycrystalline $p^+$-region 103, the i-region 104, and the $n^+$-region 105 is formed in the above-described structure.

Subsequently, a drive principle of the photodiode 114 will now be described briefly. If a positive voltage is applied to the cathode electrode 110 as compared with the anode electrode 109, a reverse voltage is applied to the diode 114. If the i-region 104 is $n^-$, a depletion layer spreads from a boundary between the $p^+$-region 103 and the i-region 104 into the i-region 104. On the other hand, if the i-region 104 is $p^-$, a depletion layer spreads from a boundary between the $n^+$-region 105 and the i-region 104 into the i-region 104. In a dark state in which the diode 114 is not irradiated with light, a minute dark current flows between the anode electrode 109 and the cathode electrode 110. If a reverse bias voltage is applied in the state in which the i-region 104 is irradiated with light, carriers of electrons and holes generated by absorbing light in the depletion layer in the i-region 104 are moved by an electric field generated in the i-region 104. The electrons arrive at the cathode electrode 110 and the holes arrive at the anode electrode 109. As a result, a photocurrent can be detected. Since the number of carriers generated by the irradiation with light is nearly proportional to the quantity of irradiation light, it becomes possible to measure illuminance by measuring the magnitude of the photocurrent. The diode can be used a measurement element of an irradiation light intensity.

The present inventors examined the intensity of illumination light with which a photodiode is illuminated, a reverse bias voltage $V_d$ applied to the photodiode, and an output photocurrent $I_p$ in detail. As a result, the present inventors have newly found that there are correlations among the photocurrent $I_p$, the reverse bias voltage $V_d$, and a length $L_i$ of an i-type semiconductor region in a direction sandwiched between a p-type semiconductor region and an n-type semiconductor region.

Figure 9:
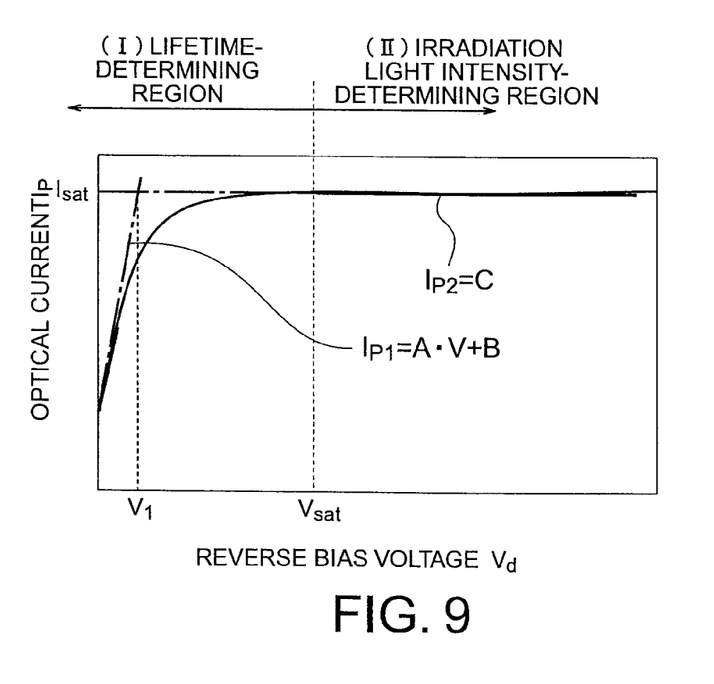
FIG. 9 is a diagram showing $I_p$-$V_p$ characteristics of an optical sensor element.

FIG. 9 shows dependence of the photocurrent $I_p$ upon the reverse bias voltage $V_d$. As appreciated from FIG. 9, the photocurrent $I_p$ increases monotonously in a region in which the reverse bias voltage $V_d$ is low, whereas the photocurrent $I_p$ assumes a nearly constant value when the reverse bias voltage $V_d$ is higher than a certain constant value. A reverse bias voltage $V_d$ at which the photocurrent $I_p$ assumes the nearly constant value is referred to as saturation voltage $V_{sat}$, and the photocurrent $I_p$ at that time is referred to as saturation current $I_{sat}$. The saturation voltage may be defined as a voltage at which a value $dI_p/dV_d$ obtained by dividing an increment value $dI_p$ of the photocurrent $I_p$ by an increment value $dV_d$ of the reverse bias voltage $V_d$ satisfies the relation $$(dI_p/dV_d) < \alpha \times W \tag{1}$$

when a photodiode having a width W μm is irradiated with halogen light having a color temperature of 3000 K and a luminance of 1000 Lx. Here, α is a constant, and it may be, for example, $1 \times 10^{-13}$ A/V/μm.

If the reverse bias voltage $V_d$ is higher than the saturation voltage $V_{sat}$, almost all carriers generated in the depletion layer in the i-region arrive at the anode electrode or the cathode electrode. Therefore, the photocurrent $I_p$ hardly depends upon the reverse bias voltage $V_d$, and it can be approximated as $$I_p = I_{sat} \tag{2}$$

A region denoted by (II) in FIG. 9 is defined as irradiation light intensity-determining region.

The value of the saturation current $I_{sat}$ is nearly equal to the quantity of electric charge generated in the depletion layer in the i-region per unit time, and the value of the saturation current $I_{sat}$ can be represented as $$I_{sat} = (P \times S \times \eta \times q \times \lambda)/(h \times c) \tag{3}$$

in the case of monochromatic light by using illumination light intensity P per unit area, an area S of the depletion layer in the i-region, electric charge q of an electron, a quantum efficiency η at the time of light absorption, a wavelength λ of light, the light velocity c and the Planck constant. The value of the saturation current $I_{sat}$ in the case of monochromatic light is proportionate to the area S of the depletion layer in the i-region. Even if light is not monochromatic, the saturation current $I_{sat}$ is proportionate to the area S of the depletion layer in the i-region.

On the other hand, if the reverse bias voltage $V_d$ is lower than the saturation voltage $V_{sat}$, only carriers that have arrived at the anode electrode or the cathode electrode among carriers generated in the i-region can be detected as the photocurrent $I_p$. As the reverse bias voltage $V_d$ becomes lower, the photocurrent $I_p$ also decreases.

A region denoted by (I) in FIG. 9 is defined as lifetime-determining region. The phenomenon that the photocurrent $I_p$ becomes small as the reverse bias voltage $V_d$ becomes lower in the lifetime-determining region can be explained by lowering of the current takeout efficiency caused by carrier recombination.

The carrier recombination is a phenomenon that photocarriers generated in the i-region cannot be taken out as a current because the photocarriers carriers are trapped at a level located at a grain boundary during the drift. When the reverse bias voltage $V_d$ is applied, a field intensity $E_i$ applied to electric charges in the i-region is represented as $$E_i = V_d/L_i \tag{4}$$

A time $t_1$ taken for photocarriers generated in an end part of the i-region to drift by $L_i$ becomes $$t_1 = L_i/(\mu \times E_i) = Li^2/(\mu \times V_d) \tag{5}$$

If a lifetime τ of carrier recombination is shorter than $t_1$, the generated photocarriers are trapped.

Figure 10:
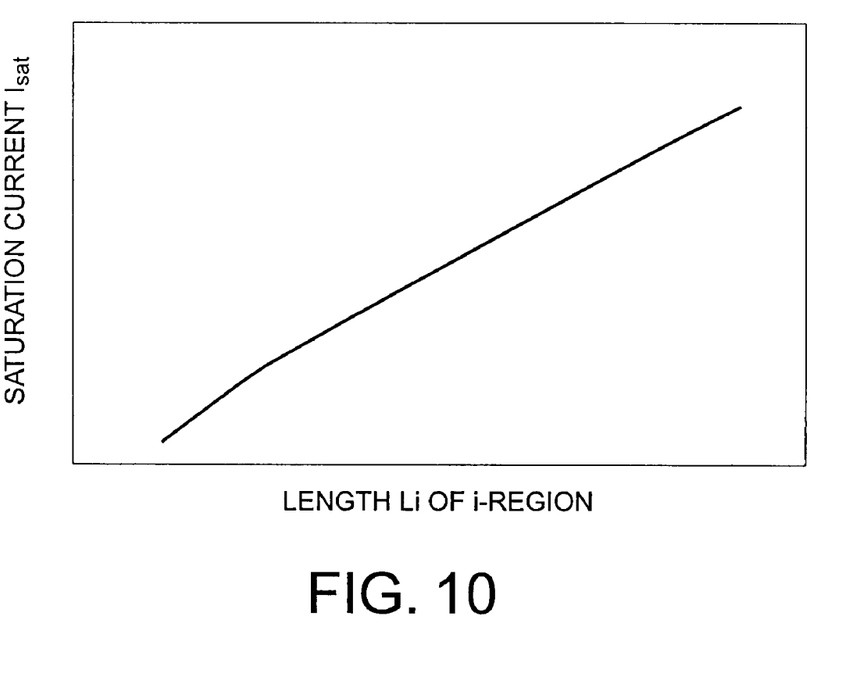
FIG. 10 is a diagram showing dependence of a saturation current of an optical sensor element upon a length of the i-region.

The saturation current $I_{sat}$ obtained when the length $L_i$ of the i-region is changed is shown in FIG. 10. The saturation current $I_{sat}$ is nearly proportional to $L_i$. This can be explained from expression (3). Supposing that the carrier recombination lifetime τ and the mobility μ are constant in the model, the saturation voltage $V_{sat}$ is obtained as the value of the reverse bias voltage $V_d$ at the time when $t_1$ is equal to τ in the expression (5). Therefore, the saturation voltage $V_{sat}$ can be represented as a function of the length $L_i$ of the i-region by the following expression.

$$V_{sat} = Li^2/(\mu \times \tau) \tag{6}$$

Figure 11:
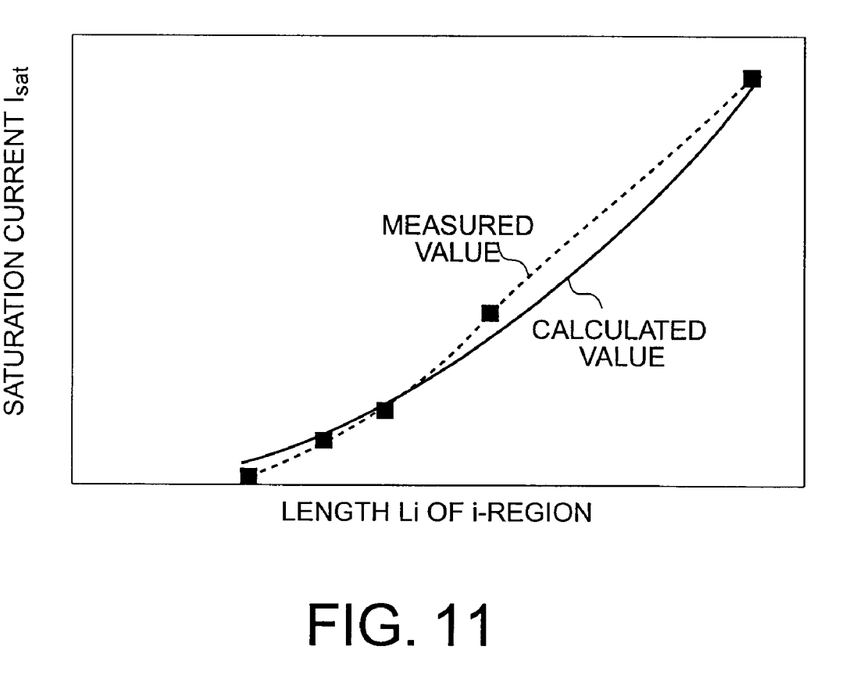
FIG. 11 is a diagram showing dependence of a saturation voltage of the optical sensor element upon the length of the i-region.

The saturation voltage $V_{sat}$ obtained from the $I_p$-$V_d$ curves measured by changing the length $L_i$ of the i-region and the expression (1) and the saturation voltage $V_{sat}$ obtained by calculation with μ and τ regarded as constants in the expression (6) are shown in FIG. 11. The saturation voltage $V_{sat}$ obtained from the measured values coincides well with the calculated value. It has been newly elucidated that the photocurrent $I_p$ depends on the reverse bias voltage $V_d$ in the lifetime-determining region because of the carrier recombination lifetime.

In the lifetime-determining region having a low reverse bias voltage $V_d$, only electrons existing in the vicinity of the $n^+$-region 105 and holes existing in the vicinity of the $p^+$-region 103 can be taken out as a current among carriers of electrons and holes generated in the length $L_i$ of the i-region, whereas other carriers disappear because of recombination. If the reverse bias voltage $V_d$ is made higher, the distance over which carriers can move during a constant time becomes longer nearly in proportion to the reverse bias voltage $V_d$. Therefore, the photocurrent $I_{p1}$ in the lifetime-determining region can be represented in a form represented by expression (7), because the photocurrent $I_{p1}$ includes a term that is nearly proportional to the reverse bias voltage $V_d$.

$$I_{p1} = A \times V_d + B \tag{7}$$

Here, A and B are constants. In the irradiation light intensity-determining region in which the reverse bias voltage $V_d$ is higher than the saturation voltage $V_{sat}$, the photocurrent $I_p$ scarcely depends on the magnitude of the reverse bias voltage $V_d$, and assumes a constant value. On the basis of the expression (2), the photocurrent $I_{p2}$ in the irradiation light intensity-determining region is represented by the following expression.

$$I_{p2} = C = I_{sat} \tag{8}$$

Here, C is a constant. As a matter of fact, transition between two regions occurs even in the lifetime-determining region as the reverse bias voltage $V_d$ approaches the saturation voltage $V_{sat}$, and consequently the value of the photocurrent $I_p$ deviates from the expression (7).

As described above, it is found that the dependence of the photocurrent $I_p$ upon the reverse bias voltage $V_d$ can be classified into the irradiation light intensity-determining region and the lifetime-determining region.

In addition, the present inventors have newly found that the variation of the photocurrent $I_p$ among optical sensor elements largely changes between the irradiation light intensity-determining region and the lifetime-determining region. Here, variations of the photocurrent $I_p$ among elements means variation of the magnitude of the photocurrent $I_p$ obtained as an output when light of the same illuminance and the same reverse bias voltage $V_d$ is applied to optical sensor elements fabricated so as to have the same shape. It is necessary to introduce an index that does not depend upon the magnitude of the absolute value of the current value as an index of the variation. Therefore, $\xi$ defined by the following expression (9) is used as the index of the magnitude of the variation.

$$\xi = \sigma_I / I_{ave} \tag{9}$$

Here, $\sigma_I$ is standard deviation of the photocurrent $I_p$ obtained by measuring the photocurrent when light of the same illuminance and the same reverse bias voltage $V_d$ is applied to optical sensor elements fabricated so as to have the same shape, and $I_{ave}$ is an average value of the photocurrent $I_p$.

Figure 12:
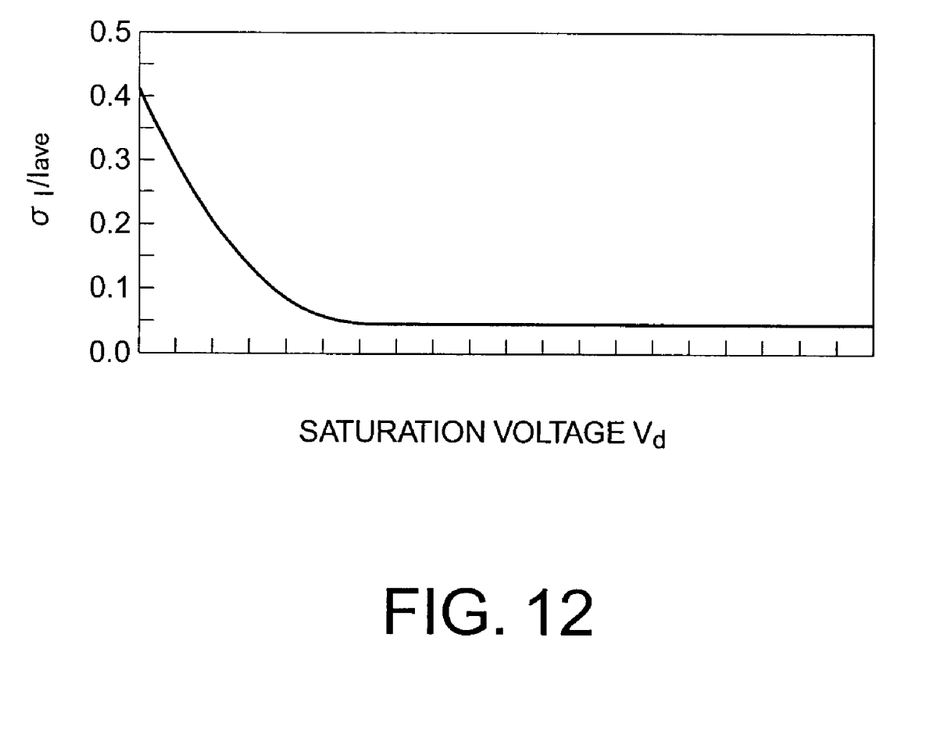
FIG. 12 is a diagram showing dependence of variation of a photocurrent of an optical sensor element upon a reverse bias voltage.

The present inventors examined dependence of $\xi$ upon the reverse bias voltage $V_d$. As a result, it has been found that relations between $\xi$ and $V_d$ are also divided into two regions as shown in FIG. 12 and variation is large in a region of $V_d$ corresponding to the lifetime-determining region shown in FIG. 9 whereas variation is small and becomes a nearly constant value in a region of $V_d$ corresponding to the irradiation light intensity-determining region. It has been found that the variation $\xi$ remarkably reduces in a transition region in which the relation $$V_1 < V_d < V_{sat} \tag{10}$$

is satisfied in the lifetime-determining region, in which $V_1$ is obtained as a crosspoint of the expression (7) and the expression (8), as compared with a region in which the reverse bias voltage $V_d$ is lower than $V_1$.

As causes of the variation, variation of sizes of element parts, such as the semiconductor film, the insulation film and the electrode, included in the element in the substrate in-plane direction and in the film thickness direction, and variation of film thickness among element parts are considerable. Since the variation in the irradiation light intensity-determining region is small, variations of the area S of the i-region and the quantum efficiency $\eta$ at the time of light absorption among elements are considered to be small. On the other hand, since variation in the lifetime-determining region is large, it is considered that the carrier mobility $\mu$ and the carrier life vary among elements. In polycrystalline silicon, a grain boundary exists between adjacent crystal grains and a large number of recombination centers are present in that part, resulting in a high probability of carriers being trapped at the grain boundaries. However, it is very difficult to uniformly control the crystal grain size and the density of the recombination centers. Therefore, it is easily analogized that $\mu$ and $\tau$ vary among elements. For the first time, the present inventors have found that the output photocurrent varies when photodiodes are used in the lifetime-determining region, by conducting detailed studies as described above.

Hereafter, embodiments of the present invention will be described in detail with reference to drawings.

First Embodiment

Figure 1:
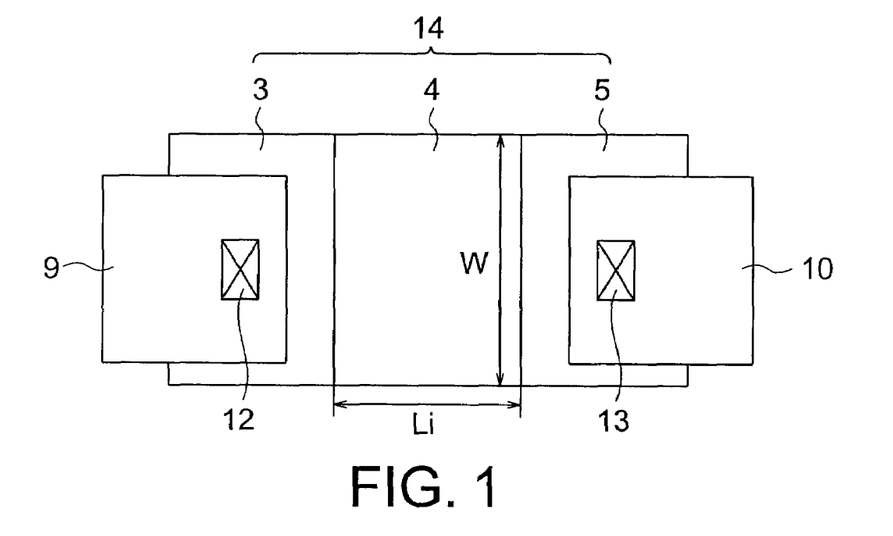
FIG. 1 is a plan view of an optical sensor element according to a first embodiment.
Figure 2:
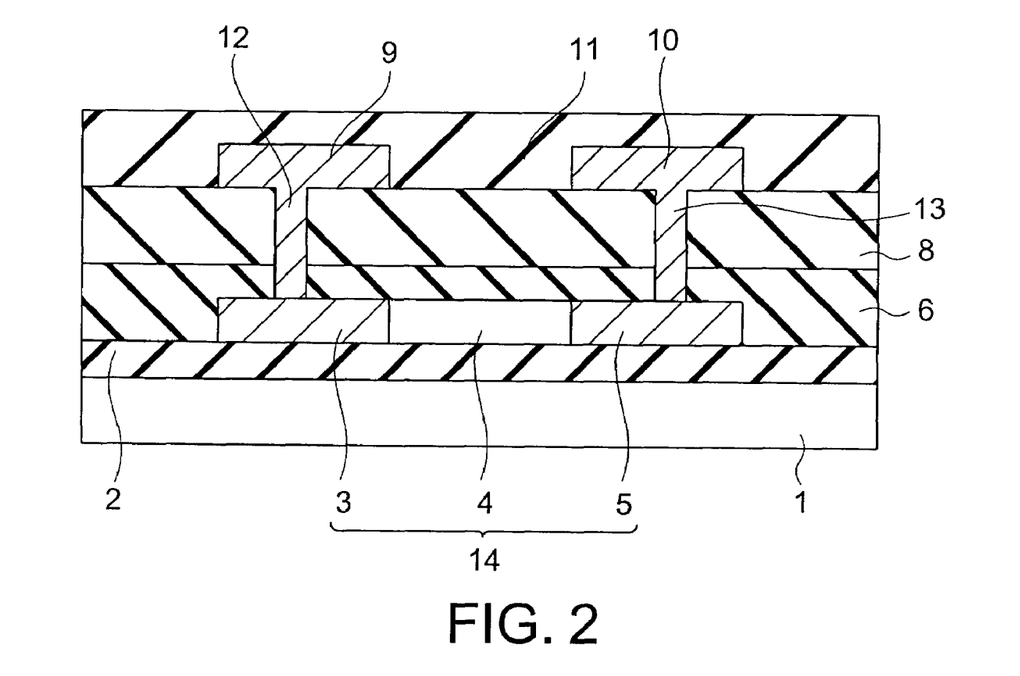
FIG. 2 is a sectional view of the optical sensor element according to the first embodiment.

An optical sensor element according to a first embodiment of the present invention will now be described. The optical sensor element according to the present embodiment is a lateral pin structure diode. Its plan view is shown in FIG. 1 and its sectional view is shown in FIG. 2.

An undercoat layer 2 formed of silicon nitride (SiNx) or silicon oxide (SiOx) is formed on a glass substrate 1 so as to have a thickness in the range of 50 to 200 nm by using the plasma CVD (Chemical Vapor Deposition) method or the like. A polycrystalline silicon film is formed on the undercoat layer 2 so as to have a thickness in the range of approximately 50 to 100 nm. This polycrystalline silicon film includes a p$^+$-region 3 doped with boron having a high concentration of approximately $1 \times 10^{19}$ cm$^{-3}$, an n$^+$-region 5 doped with phosphorus having a high concentration of approximately $1 \times 10^{19}$ cm$^{-3}$, and an i-region 4 which is provided between the p$^+$-region 3 and the n$^+$-region 5 and which is lower in concentration of impurities than the p$^+$-region 3 and the n$^+$-region 5. The i-region 4 may be doped with phosphorus or boron having a concentration in the range of approximately $1 \times 10^{15}$ to $1 \times 10^{17}$ cm$^{-3}$. A silicon oxide film 6 having a thickness in the range of approximately 50 to 200 nm is formed so as to cover the p$^+$-region 3, the i-region 4 and the n$^+$-region 5. A silicon oxide film 8 is formed on the silicon oxide film 6 so as to have a thickness in the range of approximately 200 to 600 nm. An anode electrode 9 and a cathode electrode 10 formed of a Mo—W alloy or metal such as Al or Mo are formed so as to have a thickness in the range of approximately 400 to 600 nm. The anode electrode 9 is connected to the p$^+$-region 3 via a contact 12 provided through the silicon oxide film 8 and the silicon oxide film 6. The cathode electrode 10 is connected to the n$^+$-region 5 via a contact 13 provided through the silicon oxide film 8 and the silicon oxide film 6. A silicon nitride film 11 is formed so as to cover the silicon oxide film 8, the anode electrode 9 and the cathode electrode 10. A length $L_i$ of the i-region 4 sandwiched between the p$^+$-region 3 and the n$^+$-region 5 is 20 µm. A width W of the i-region 4 in a direction perpendicular to $L_i$ is 60 µm. By taking such a structure, a photodiode 14 having a lateral pin structure is formed.

Figure 3:
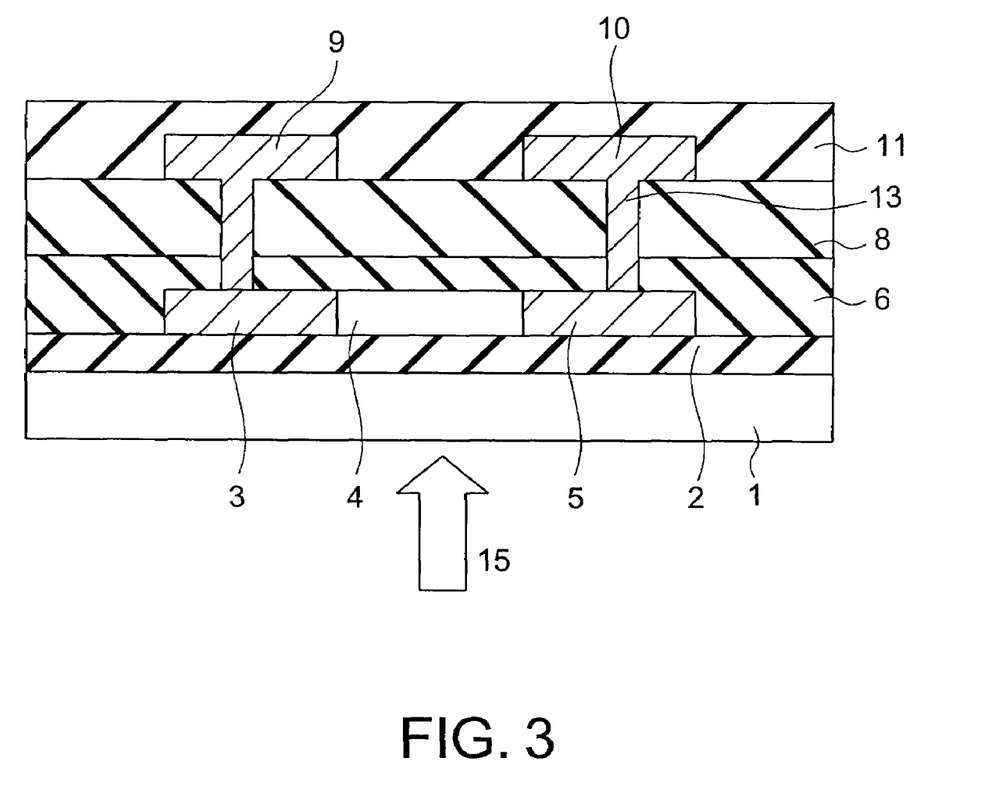
FIG. 3 is a sectional view obtained when the optical sensor element according to the first embodiment is irradiated with light in order to find $I_p$-$V_p$ characteristics.
Figure 4:
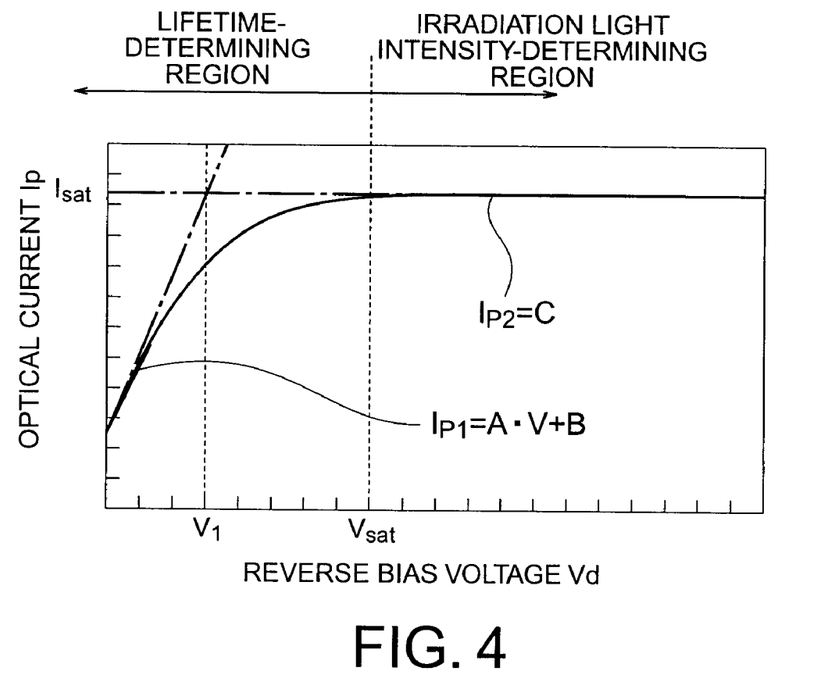
FIG. 4 is a diagram showing $I_p$-$V_p$ characteristics of an optical sensor element.

The photodiode 14 according to the present embodiment is irradiated with irradiation light 15 of 1000 Lx from the back of the substrate 1 as shown in FIG. 3. A result obtained by finding relations between the reverse bias voltage $V_d$ applied to the photodiode and the photocurrent $I_p$ is shown in FIG. 4. In a lifetime-determining region in which the reverse bias voltage $V_d$ is low, the photocurrent $I_p$ also increases as the reverse bias voltage $V_d$ increases. If the reverse bias voltage $V_d$ becomes higher than a certain constant voltage, $I_p$ becomes nearly constant irrespective of $V_d$. A region in which $I_p$ becomes nearly constant is referred to as irradiation light intensity-determining region. A minimum value of $V_d$ in the irradiation light intensity-determining region is referred to as saturation voltage $V_{sat}$. As for how to find the saturation voltage $V_{sat}$, the saturation voltage $V_{sat}$ may be defined as, for example, a voltage at which a value $dI_p/dV_d$ obtained by dividing an increment value $dI_p$ of the photocurrent $I_p$ by an increment value $dV_d$ of the reverse bias voltage $V_d$ satisfies the relation $$(dI_p/dV_d) < \alpha \times W \tag{11}$$

when the photodiode 14 having a width of W µm is irradiated with halogen light having a color temperature of 3000 K and a luminance of 1000 Lx. Here, $\alpha$ is a constant, and it may be, for example, $1 \times 10^{-13}$ A/V/µm.

As a tangential line for $I_p$-$V_d$ characteristics at $V_d$=0 in the lifetime-determining region defined as a region in which the reverse bias voltage $V_d$ is lower than the saturation voltage $V_{sat}$, $$I_{p1} = A \times V_d + B \tag{12}$$

is found.

As for how to find the tangential line for the $I_p$-$V_d$ characteristics at $V_d$=0, the tangential line can be found using linear approximation by applying the least square method to values of the photocurrent $I_p$ obtained when voltages near $V_d=0$ are applied. For example, the range between $V_d=0$ and $V_d=V_{sat}/20$ is divided into five equal parts, and the value of the photocurrent $I_p$ is measured at six points: $V_d=0$, $V_d=V_{sat}/100$, $V_d=2\times V_{sat}/100$, $V_d=3\times V_{sat}/100$, $V_d=4\times V_{sat}/100$, $V_d=5\times V_{sat}/100$. Thus, linear approximation can be conducted by using the least square method.

The photocurrent $I_{p2}$ in the irradiation lifetime-determining region is nearly constant. Regarding C which is the value of the photocurrent $I_p$ at the saturation voltage $V_{sat}$ as a constant, the following approximation can be made:

$$I_{p2}=C=I_{sat} \tag{13}$$

On the basis of dependence of the photocurrent $I_p$ upon the reverse bias voltage $V_d$ at the time when a photodiode that is 60 μm in width W of the i-region 4 and 20 μm in length $L_i$ is irradiated with halogen light having a color temperature of 3000 K and an illuminance of 1000 Lx from a direction indicated by an arrow in FIG. 3, the following values are obtained.

$$V_{sat}=8\,V$$

$$A=3.0\times 10^{-11}\,A/V \tag{14}$$

$$B=2.0\times 10^{-11}\,A \tag{15}$$

$$C=1.7\times 10^{-10}\,A$$

By using these values, $V_1$ which is the reverse bias voltage $V_d$ satisfying the relation $$I_{p1}=I_{p2}$$

is found to be $$V_1=5.0\,V \tag{16}$$

Figure 5:
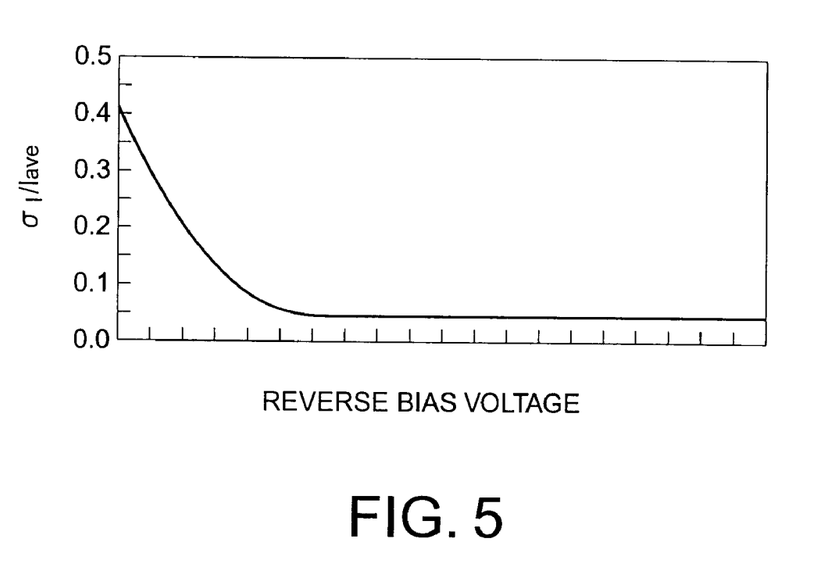
FIG. 5 is a diagram showing dependence of variation of a photocurrent of an optical sensor element upon a reverse bias voltage.

Similar measurements are conducted on fifteen photodiodes 14 fabricated so as to have the same shape. Variation ξ is represented as $$\xi=\sigma_f/I_{ave} \tag{17}$$

where $\sigma_f$ is the standard deviation of the measured values, and $I_{ave}$ is the average value. Dependence of the variation ξ upon the reverse bias voltage $V_d$ is shown in FIG. 5. It is appreciated in the lifetime-determining region in which the reverse bias voltage $V_d$ is low the variation ξ decreases as $V_d$ increases. In the irradiation light intensity-determining region in which the value of the photocurrent $I_p$ hardly depends upon the reverse bias voltage $V_d$, the value of the variation ξ changes little, either.

On the other hand, if the length Li of the i-region is made large to increase the light absorbing area S, the saturation current $I_{sat}$ increases according to the expression (3) whereas the saturation voltage $V_{sat}$ also increases according to the expression (6). It is not desirable to make the reverse bias voltage $V_d$ higher than needed because the reverse bias voltage $V_d$ is restricted by power dissipation and device withstand voltage. The saturation voltage $V_{sat}$ is a function of the length $L_i$ of the i-region 4 as indicated by the expression (6). Denoting a length $L_i$ of the i-region 4 at the time when the reverse bias voltage $V_d$ becomes the saturation voltage $V_{sat}$ by $L_{isat}$, it can be found according to the following expression.

$$L_{isat}=(\mu\times\tau\times V_{sat})^{1/2} \tag{18}$$

The photodiode performs operation in a transitional region near the irradiation light intensity-determining region in the lifetime-determining region, by setting the length $L_i$ of the i-region 4 so as to cause the reverse bias voltage $V_b$ applied at the time of photocurrent detection to satisfy the following relation.

$$V_1<V_b<V_{sat} \tag{19}$$

Therefore, the length $L_i$ of the i-region 4 can be made greater than $L_{isat}$. It is possible to obtain a photodiode having a great photocurrent $I_p$ and a variation ξ reduced to 0.1 by making the length $L_i$ of the i-region 4 longer than that used in the irradiation lifetime-determining region.

Second Embodiment

A second embodiment of the present invention is a TFT array. A TFT array is formed by arranging the optical sensor elements of lateral pin structure diode type according to the first embodiment and thin film transistors on a substrate in a matrix form. A TFT-LCD with optical sensors integrally formed is thus implemented.

It becomes possible to conduct operation in the irradiation light intensity-determining region and reduce the variation ξ of the photocurrent as compared with that in operation in the lifetime-determining region, by making the reverse bias voltage $V_b$ applied at the time of photocurrent detection higher than the saturation voltage $V_{sat}$ so as to satisfy the following relation.

$$V_{sat}<V_b<1.2V_{sat} \tag{20}$$

The saturation voltage $V_{sat}$ varies by approximately 20% at maximum among elements. By selecting the length $L_i$ of the i-region 4 so as to satisfy the expression (20), therefore, the photodiode is made to operate in the irradiation light intensity-determining region without making the reverse bias voltage $V_b$ higher than needed. As a result, the variation ξ can be reduced to 0.05%.

Third Embodiment

Figure 6:
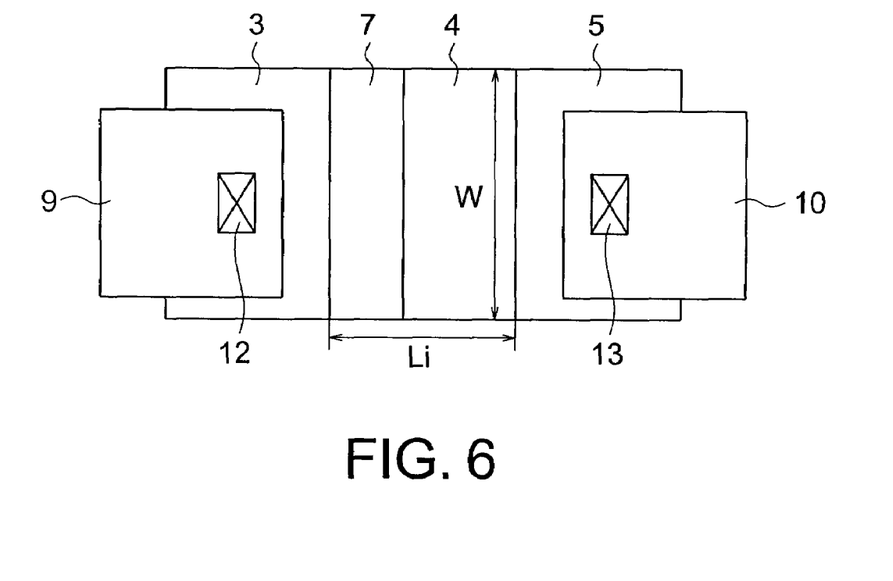
FIG. 6 is a plan view of an optical sensor element according to a third embodiment.
Figure 7:
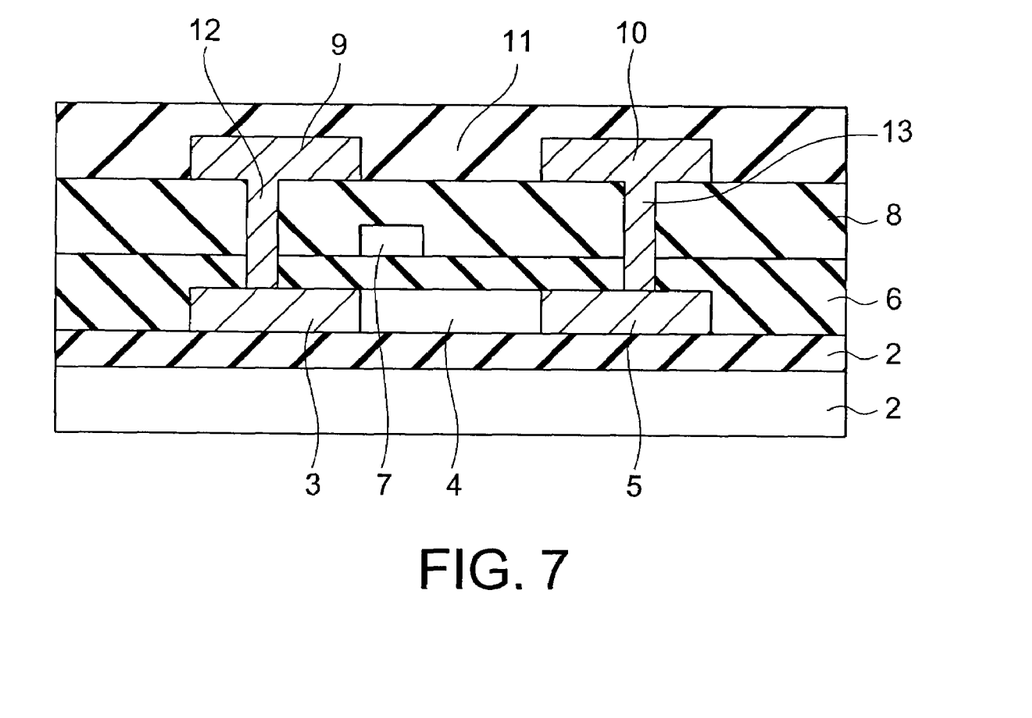
FIG. 7 is a sectional view of the optical sensor element according to the third embodiment.

An optical sensor element of lateral pin structure diode type according to a third embodiment of the present invention will now be described. A plan view and a sectional view of the optical sensor element (photodiode) according to the present embodiment are shown in FIGS. 6 and 7, respectively.

The optical sensor element according to the present embodiment has a configuration obtained from the optical sensor element according to the first embodiment shown in FIGS. 1 and 2 by providing a gate electrode 7 on the silicon oxide film (gate insulation film) 6 so as to cover a partial region of the i-region 4. In the present embodiment, the partial region of the i-region 4 is provided on the anode electrode 9 side, and the partial region of the i-region 4 is shorter in length than the length $L_i$ of the i-region 4, but has the same width W as that of the i-region 4. By the way, the gate electrode 7 is covered by the silicon oxide film 8.

In the same way as the first embodiment, in the optical sensor element according to the present embodiment as well, the photodiode performs operation in a transitional region near the irradiation light intensity-determining region in the lifetime-determining region, by setting the length $L_i$ of the i-region 4 so as to cause the reverse bias voltage $V_b$ applied at the time of photocurrent detection to satisfy the following relation.

$$V_1<V_b<V_{sat} \tag{19}$$

Therefore, the length $L_i$ of the i-region 4 can be made greater than $L_{isat}$. It is possible to obtain a photodiode having a great photocurrent $I_p$ and a variation ξ reduced to 0.1 by making the length $L_i$ of the i-region 4 longer than that used in the irradiation light intensity-determining region.

As described with reference to the second embodiment, it becomes possible to conduct operation in the irradiation light intensity-determining region and reduce the variation ξ of the photocurrent as compared with that in operation in the lifetime-determining region, by making the reverse bias voltage $V_b$ applied at the time of photocurrent detection higher than the saturation voltage $V_{sat}$ so as to satisfy the following relation.

$$V_{sat} < V_b < 1.2 \times V_{sat} \quad (20)$$

The saturation voltage $V_{sat}$ varies by approximately 20% at maximum among elements. By selecting the length $L_i$ of the i-region 4 so as to satisfy the expression (20), therefore, the photodiode is made to operate in the irradiation light intensity-determining region without making the reverse bias voltage $V_d$ higher than needed. As a result, the variation ξ can be reduced to 0.05%. When applying a common reverse bias voltage $V_d$ to a plurality of arranged photodiodes, the saturation voltage $V_{sat}$ varies among elements. Unless a voltage higher than an average saturation voltage $V_{sat}$ is applied, some photodiodes do not operate in the irradiation light intensity-determining region. On the other hand, it is not desirable to make the reverse bias voltage $V_d$ higher than needed. The variation of the saturation voltage $V_{sat}$ among elements is approximately 20% at maximum. If the reverse bias voltage $V_d$ is made higher than $1.2 \times V_{sat}$, a voltage higher than the saturation voltage $V_{sat}$ is applied to all elements and a reverse bias voltage $V_d$ higher than needed is applied. By applying a voltage higher than the saturation voltage $V_{sat}$ and lower than $1.2 \times V_{sat}$ as the reverse bias voltage $V_d$, the proportion of elements that operate in the irradiation light intensity-determining region increases even in the case where the saturation voltage $V_{sat}$ of the elements varies. As a result, the variation of the photocurrent $I_p$ can be reduced.

According to the embodiments of the present invention, it is possible to make the output of the photocurrent large and make the output variation small, as heretofore described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A method for driving an optical sensor element having a lateral pin structure and including a p-type semiconductor region, an n-type semiconductor region, an i-type semiconductor region which is formed between the p-type semiconductor region and the n-type semiconductor region and which is lower in impurity concentration than the p-type semiconductor region and the n-type semiconductor region, an anode electrode connected to the p-type semiconductor region, and a cathode electrode connected to the n-type semiconductor region, the method comprising:

applying a reverse bias voltage $V_b$ when detecting a photocurrent, the reverse bias voltage $V_b$ satisfying a following relation, $$V_1 < V_b < V_{sat}$$

where $V_d$ denotes a reverse bias voltage between the anode electrode and the cathode electrode, $I_p$ denotes the photocurrent flowing between the anode electrode and the cathode electrode when the i-type semiconductor region is irradiated with light, $V_{sat}$ denotes a saturation voltage in $I_p$-$V_d$ characteristics, and $V_1$ denotes a reverse bias voltage $V_d$ at a crosspoint of a tangential line at $V_d$=0 for the $I_p$-$V_d$ characteristics in a first region in which the reverse bias voltage $V_d$ is lower than the saturation voltage $V_{sat}$ and a straight line of the $I_p$-$V_d$ characteristics in a second region in which the reverse bias voltage $V_d$ is the saturation voltage $V_{sat}$ or more.

2. A method for driving an optical sensor element having a lateral pin structure and including a p-type semiconductor region, an n-type semiconductor region, an i-type semiconductor region which is formed between the p-type semiconductor region and the n-type semiconductor region and which is lower in impurity concentration than the p-type semiconductor region and the n-type semiconductor region, an anode electrode connected to the p-type semiconductor region, and a cathode electrode connected to the n-type semiconductor region, the method comprising:

applying a reverse bias voltage $V_b$ when detecting a photocurrent, the reverse bias voltage $V_b$ satisfying a following relation, $$V_{sat} < V_b < 1.2 \times V_{sat}$$

where $V_d$ denotes a reverse bias voltage between the anode electrode and the cathode electrode, $I_p$ denotes the photocurrent flowing between the anode electrode and the cathode electrode when the i-type semiconductor region is irradiated with light, and $V_{sat}$ denotes a saturation voltage in $I_p$-$V_d$ characteristics.

3. The method according to claim 1, wherein the p-type semiconductor region, the n-type semiconductor region and the i-type semiconductor region comprise polycrystalline silicon.

4. The method according to claim 1, wherein the i-type semiconductor region is a p-type semiconductor region which is lower in impurity concentration than the p-type semiconductor region.

5. The method according to claim 1, wherein the i-type semiconductor region is an n-type semiconductor region which is lower in impurity concentration than the n-type semiconductor region.

6. The method according to claim 1, wherein the optical sensor element further comprises:

a gate insulation film formed between the insulation film, and the p-type semiconductor region, the n-type semiconductor region and the i-type semiconductor region so as to cover the p-type semiconductor region, the n-type semiconductor region and the i-type semiconductor region; and a gate electrode provided on the gate insulation film so as to cover a partial region of the i-type semiconductor region.

7. The method according to claim 2, wherein the p-type semiconductor region, the n-type semiconductor region and the i-type semiconductor region comprise polycrystalline silicon.

8. The method according to claim 2, wherein the i-type semiconductor region is a p-type semiconductor region which is lower in impurity concentration than the p-type semiconductor region.

9. The method according to claim 2, wherein the i-type semiconductor region is an n-type semiconductor region which is lower in impurity concentration than the n-type semiconductor region.

10. The method according to claim 2, wherein the optical sensor element further comprises:

a gate insulation film formed between the insulation film, and the p-type semiconductor region, the n-type semiconductor region and the i-type semiconductor region so as to cover the p-type semiconductor region, the n-type semiconductor region and the i-type semiconductor region; and a gate electrode provided on the gate insulation film so as to cover a partial region of the i-type semiconductor region.

* * * * *